US012765022B2

(12) United States Patent
Kim et al.

(10) Patent No.: US 12,765,022 B2
(45) Date of Patent: Oct. 13, 2026

(54) TRANSISTOR AND MANUFACTURING METHOD THEREOF

(71) Applicants: Samsung Display Co., LTD., Yongin-si (KR); YONSEI UNIVERSITY, UNIVERSITY-INDUSTRY FOUNDATION (UIF), Seoul (KR)

(72) Inventors: Hyung Jun Kim, Seoul (KR); Hyungjun Kim, Seoul (KR); Jun Hyung Lim, Seoul (KR); Hwi Yoon, Seoul (KR); Seung-min Chung, Seoul (KR)

(73) Assignees: Samsung Display Co., Ltd., Yongin-si (KR); YONSEI UNIVERSITY, UNIVERSITY-INDUSTRY FOUNDATION (UIF), Seoul (KR)

(*) Notice: Subject to any disclaimer, the term of this patent is extended or adjusted under 35 U.S.C. 154(b) by 934 days.

(21) Appl. No.: 17/944,888

(22) Filed: Sep. 14, 2022

(65) Prior Publication Data

US 2023/0135686 A1 May 4, 2023

(30) Foreign Application Priority Data

Nov. 2, 2021 (KR) ........................ 10-2021-0148887

(51) Int. Cl.
*H10D 62/80* (2025.01)
*H10D 64/01* (2025.01)

(52) U.S. Cl.
CPC ............. *H10D 62/80* (2025.01); *H10D 64/01* (2025.01)

(58) Field of Classification Search
CPC ......... H01L 21/02568; H01L 21/02417; H01L 21/02562; H01L 21/0256; H01L 21/02557;

(Continued)

(56) References Cited

U.S. PATENT DOCUMENTS

| | | | |
|---|---|---|---|
| 2011/0030991 | A1 | 2/2011 | Veerasamy |
| 2016/0093689 | A1 | 3/2016 | George et al. |

(Continued)

FOREIGN PATENT DOCUMENTS

| | | | |
|---|---|---|---|
| JP | 2021-068719 | A | 4/2021 |
| KR | 10-2017-0014870 | A | 2/2017 |

(Continued)

OTHER PUBLICATIONS

Lin, Yu-Chuan et al., "Controllable Thin-Film Approaches for Doping and Alloying Transition Metal Dichalcogenides Monolayers", Adv. Sci. vol. 8 No. 9 1-26 (26 pages).

(Continued)

*Primary Examiner* — Chad M Dicke
*Assistant Examiner* — Priya M Rampersaud
(74) *Attorney, Agent, or Firm* — Womble Bond Dickinson (US) LLP

(57) ABSTRACT

A transistor includes a semiconductor layer on a substrate, a gate electrode overlapping the semiconductor layer, and a source electrode and a drain electrode electrically connected to the semiconductor layer. The semiconductor layer includes a second material doped to a first material. The first material includes a compound expressed as XYa of a Chemical Formula. X is one of Mo, W, Zr, or Re, Y is one of S, Se, or Te, and a is a natural number that is equal to or greater than 1. The second material includes at least one of W, Hf, Ta, Ti, Pt, Ni, Ga, or Zr. The second material includes an element that is different from the first material.

11 Claims, 11 Drawing Sheets

(58) Field of Classification Search
CPC ........... H01L 21/02485; H01L 21/0248; H01L 21/02411; H01L 21/02409; H01L 2924/0111; H01L 2924/01042; H01L 2924/01074; H01L 21/02406; H01L 2924/01034; H01L 2924/10722; H10D 62/883; H10D 30/675; H10D 30/031; H10D 30/01; H10D 30/67; H10D 30/6728; H10D 48/04; H10D 64/01; H10D 86/60; H10D 62/80; H10D 30/0314; H10D 30/017; H10D 30/6757; C23C 16/305; C23C 14/0623; C23C 14/5866; C30B 29/46; C01B 19/007; C01B 19/00; C22C 27/04; C22C 38/22
See application file for complete search history.

(56) References Cited

U.S. PATENT DOCUMENTS

2020/0058488 A1 2/2020 Lim et al.
2021/0005714 A1 1/2021 Tomida
2021/0074543 A1* 3/2021 Kim ........................ H10D 30/47
2021/0343817 A1* 11/2021 Lim ..................... H10P 14/3436
2022/0199838 A1* 6/2022 Dorow ............... H10D 30/6757

FOREIGN PATENT DOCUMENTS

KR 10-2020-0021030 A 2/2020
KR 10-2021-0030775 A 3/2021
KR 10-2258466 B1 6/2021

OTHER PUBLICATIONS

Japanese Office action dated Jun. 2, 2026 issued in corresponding Japanese Patent Application No. 2022-130395, 4 pages.

* cited by examiner

TRANSISTOR AND MANUFACTURING METHOD THEREOF

CROSS-REFERENCE TO RELATED APPLICATION

This application claims priority to and the benefit of Korean Patent Application No. 10-2021-0148887, filed in the Korean Intellectual Property Office (KIPO) on Nov. 2, 2021, the entire content of which is incorporated by reference herein.

BACKGROUND

1. Field

The present disclosure relates to a transistor and a method for manufacturing a transistor.

2. Description of the Related Art

A semiconductor material in a layered structure is spotlighted as a next-generation semiconductor material because of its flexibility and transparency. In more detail, transition metal dichalcogenides (TMDCs) highlighted as materials of next-generation electronic parts have characteristics of a thin-film thickness, high mobility (several tens to several hundreds $cm^2/V\cdot s$), and a high on/off ratio, and are in the limelight as a channel material for transparent and flexible display thin film transistors, a channel material for overcoming scaling of electronic parts, and a material of electronic sensors with a high sensitivity characteristic.

The above information disclosed in this Background section is only for enhancement of understanding of the background of the present disclosure, and therefore, it may contain information that does not constitute prior art.

SUMMARY

Aspects of one or more embodiments of the present disclosure are directed to a transistor for controlling (e.g., easily controlling) a threshold voltage and improving reliability, and a method for manufacturing a transistor.

An embodiment of the present disclosure provides a transistor including: a semiconductor layer on a substrate; a gate electrode overlapping the semiconductor layer; and a source electrode and a drain electrode electrically connected to the semiconductor layer. The semiconductor layer includes a second material doped to a first material. The first material includes a compound expressed as XYa of a Chemical Formula. X is one of molybdenum (Mo), tungsten (W), zirconium (Zr), or rhenium (Re) (e.g., one selected from among Mo, W, Zr, and Re), Y is one of sulfur (S), selenium (Se), or tellurium (Te) (e.g., one selected from among S, Se, and Te), and a is a natural number that is equal to or greater than 1. The second material includes at least one of tungsten (W), hafnium (Hf), tantalum (Ta), titanium (Ti), platinum (Pt), nickel (Ni), gallium (Ga), or zirconium (Zr) (e.g., at least one selected from among W, Hf, Ta, Ti, Pt, Ni, Ga, and Zr). The second material includes an element that is different from the first material (e.g., the second material is different in element from the first material).

The semiconductor layer may include a semiconductor material with a layered structure.

A thickness of the semiconductor layer may be equal to or less than 1.5 nm.

Equal to or less than 7.5 wt % of the second material may be included with respect to an entire content of the semiconductor material.

3.0 wt % to 7.5 wt % of the second material may be included with respect to the entire content of the semiconductor material.

5.0 wt % to 7.5 wt % of the second material may be included with respect to the entire content of the semiconductor material.

A threshold voltage of the transistor may have a positive value.

The threshold voltage may be positively shifted as a content of the second material increases.

The second material may be substituted with a position of the X in the first material expressed as XYa of the Chemical Formula.

Another embodiment of the present disclosure provides a method for manufacturing a transistor, the method including: forming a semiconductor layer on a substrate; forming a gate electrode overlapping the semiconductor layer; and forming a source electrode and a drain electrode electrically connected to the semiconductor layer. The forming the semiconductor layer includes inputting a first precursor, a second precursor, and a reactant into a chamber to form a semiconductor material. The semiconductor material includes a second material doped to a first material. The first material includes a compound expressed as XYa of a Chemical Formula, X is one of molybdenum (Mo), tungsten (W), zirconium (Zr), or rhenium (Re) (e.g., one selected from among Mo, W, Zr, and Re), Y is one of sulfur (S), selenium (Se), or tellurium (Te) (e.g., one selected from among S, Se, and Te), and a is a natural number that is equal to or greater than 1. The second material includes at least one of tungsten (W), hafnium (Hf), tantalum (Ta), titanium (Ti), platinum (Pt), nickel (Ni), gallium (Ga), or zirconium (Zr) (e.g., at least one selected from among W, Hf, Ta, Ti, Pt, Ni, Ga, and Zr).

The second material may include an element that is different from the first material (e.g., the second material may be different in element from the first material).

The forming the semiconductor layer may include injecting an inert gas. A doping content of the second material may be controlled according to an injecting speed of the inert gas The semiconductor material may be formed to have a layered structure.

The semiconductor layer may be formed to have a thickness of equal to or less than 1.5 nm.

Equal to or less than 7.5 wt % of the second material may be included with respect to an entire content of the semiconductor material.

3.0 wt % to 7.5 wt % of the second material may be included with respect to the entire content of the semiconductor material.

5.0 wt % to 7.5 wt % of the second material may be included with respect to the entire content of the semiconductor material.

A threshold voltage of the transistor may have a positive value.

A threshold voltage may be positively shifted as a content of the second material increases.

The second material may be substituted with a position of the X in the first material expressed as XYa of the Chemical Formula.

According to the embodiments, the transistor for controlling (e.g., easily controlling) a threshold voltage and improving reliability and the manufacturing method thereof may be provided. In one or more embodiments, the manufacturing process for providing the above-noted transistor may be simple and the time for the process may be reduced.

DETAILED DESCRIPTION

Figure 1:
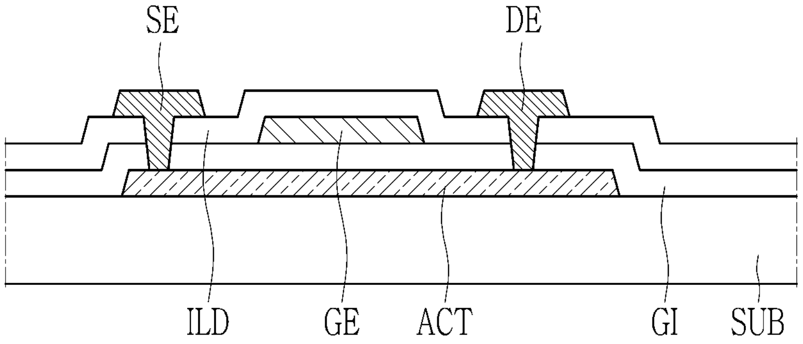
FIG. 1 shows a cross-sectional view of a transistor according to one or more embodiments.

The present disclosure will be described more fully hereinafter with reference to the accompanying drawings, in which example embodiments of the disclosure are shown. Like reference numerals in the drawings denote like elements throughout, and duplicative descriptions thereof may not be provided. As those skilled in the art would realize, the described embodiments may be modified in various suitable ways, all without departing from the spirit or scope of the present disclosure.

The terminology used herein is for the purpose of describing particular embodiments only and is not intended to limit the embodiments described herein.

As used herein, the singular forms "a," "an," and "the" are intended to include the plural forms as well, unless the context clearly indicates otherwise.

Parts that are irrelevant to the description may not be provided to clearly describe the present disclosure, and the same elements will be designated by the same reference numerals throughout the specification.

The size and thickness of each configuration shown in the drawings are arbitrarily shown for better understanding and ease of description, but the present disclosure is not limited thereto. In the drawings, the thickness of layers, films, panels, regions, etc., are enlarged for clarity. The thicknesses of some layers and areas may be exaggerated for convenience of explanation.

It will be understood that when an element such as a layer, film, region, or substrate is referred to as being "on" another element, it can be directly on the other element or one or more intervening elements may also be present. In contrast, when an element is referred to as being "directly on" another element, there are no intervening elements present. The word "on" or "above" refers to positioned on or below the object portion, and does not necessarily refer to positioned on the upper side of the object portion based on a gravitational direction.

Spatially relative terms, such as "beneath," "below," "lower," "above," "upper," "bottom," "top," and the like, may be used herein for ease of description to describe one element or feature's relationship to another element(s) or feature(s) as illustrated in the drawings. It will be understood that the spatially relative terms are intended to encompass different orientations of the device in use or operation in addition to the orientation depicted in the drawings. For example, if the device in the drawings is turned over, elements described as "below" or "beneath" other elements or features would then be oriented "above" or "over" the other elements or features. Thus, the term "below" may encompass both an orientation of above and below. The device may be otherwise oriented (rotated 90 degrees or at other orientations), and the spatially relative descriptors used herein should be interpreted accordingly.

It will be further understood that the terms "includes," "including," "comprises," and/or "comprising," when used in this specification, specify the presence of stated features, steps, operations, elements, and/or components, but do not preclude the presence or addition of one or more other features, steps, operations, elements, components, and/or groups thereof.

As used herein, the terms "substantially," "about," and similar terms are used as terms of approximation and not as terms of degree, and are intended to account for the inherent deviations in measured or calculated values that would be recognized by those of ordinary skill in the art. "About" or "approximately," as used herein, is inclusive of the stated value and refers to within an acceptable range of deviation for the particular value as determined by one of ordinary skill in the art, considering the measurement in question and the error associated with measurement of the particular quantity (i.e., the limitations of the measurement system). For example, "about" may refer to within one or more standard deviations, or within ±30%, 20%, 10%, 5% of the stated value.

As used herein, expressions such as "at least one of," "one of," and "selected from," when preceding a list of elements, modify the entire list of elements and do not modify the individual elements of the list.

As used herein, the term "and/or" includes any and all combinations of one or more of the associated listed items.

Further, the use of "may" when describing embodiments of the present disclosure refers to "one or more embodiments of the present disclosure."

The phrase "in a plan view" refers to viewing the object portion from the top, and the phrase "in a cross-sectional view" refers to viewing a cross-section of which the object portion is vertically cut from the side.

Although the terms first, second, etc. may be used to describe various elements, these elements should not be limited by these terms. These terms are only used to distinguish one element from another element. For example, a first element may be referred to as a second element, and similarly, a second element may also be referred to as a first element without departing from the scope of the present disclosure.

Unless otherwise defined, all terms (including technical and scientific terms) used herein have the same meaning as commonly understood by one of ordinary skill in the art to which this disclosure pertains. Terms, such as those defined in commonly used dictionaries, should be interpreted as having a meaning that is consistent with their meaning in the context of the relevant art and should not be interpreted in an idealized or overly formal sense, unless expressly so defined herein.

Figure 2:
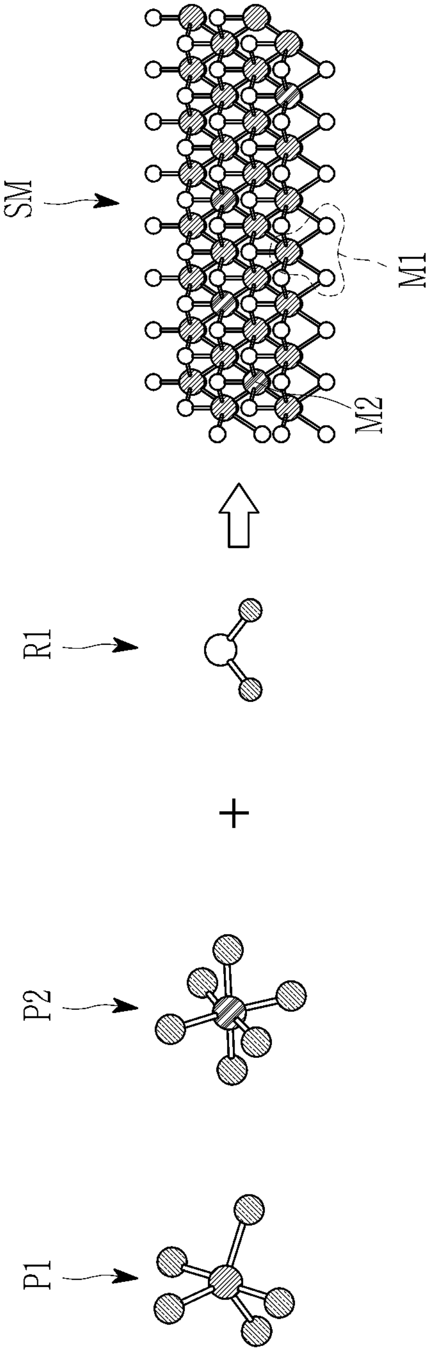
FIG. 2 shows a reaction schematic view for manufacturing a semiconductor material according to one or more embodiments.

A transistor according to one or more embodiments will now be described with reference to FIG. 1 and FIG. 2. FIG. 1 shows a cross-sectional view of a transistor according to one or more embodiments, and FIG. 2 shows a schematic view of a semiconductor material forming a semiconductor layer.

The transistor according to one or more embodiments may be disposed on a substrate (SUB). The substrate (SUB) may include a transparent substance such as glass. The substrate (SUB) is not limited thereto and the substrate (SUB) may include various suitable types of materials such as transparent plastic or a metal.

Although not shown in the present specification, a buffer layer disposed on the substrate (SUB) may be further included. The buffer layer may prevent or substantially prevent impurity ions from spreading into the semiconductor elements, and may planarize the surface.

A semiconductor (or active) layer (ACT) may be positioned on the substrate (SUB). The semiconductor layer (ACT) may include a semiconductor material with a layered structure. Detailed descriptions thereof will be provided with reference to FIG. 2.

A thickness of the semiconductor layer (ACT) may be equal to or less than about 1.5 nm. The semiconductor layer (ACT) may be very thin, by which flexibility of the transistor may increase.

The semiconductor layer (ACT) may be formed by a chemical vapor deposition (CVD) process, a plasma chemical vapor deposition (PECVD) process, an atomic layer deposition (ALD) process, and/or a sputter process.

A gate insulating layer (GI) may be positioned on the semiconductor layer (ACT) and the substrate (SUB). The gate insulating layer (GI) may include an inorganic material such as a silicon nitride, a silicon oxide, or a silicon oxynitride.

A gate electrode (GE) may be positioned on the gate insulating layer (GI). The gate electrode (GE) may overlap the semiconductor layer (ACT). The present specification shows one or more embodiments in which the gate electrode (GE) is positioned on the semiconductor layer (ACT), and without being limited thereto, one or more embodiments in which the gate electrode (GE) is positioned below the semiconductor layer (ACT) is also allowable.

A source electrode (SE) and a drain electrode (DE) may be positioned on the gate electrode (GE) and the inter-layer insulating layer (ILD). Each of the source electrode (SE) and the drain electrode (DE) may be connected (e.g., electrically connected) to the semiconductor layer (ACT) through contact holes formed in the interlayer insulating layer (ILD) and the gate insulating layer (GI).

A semiconductor material for forming the semiconductor layer (ACT) will now be described with reference to FIG. 2.

The semiconductor layer (ACT) may include a semiconductor material (SM), for example, a semiconductor material (SM) with a layered structure. The semiconductor material (SM) in a layered structure may be the transition metal dichalcogenide (TMDC).

The semiconductor material (SM) may include a first material (M1) and a second material (M2). In more detail, the semiconductor material (SM) may include a first material (M1), and a second material (M2) doped to the first material (M1).

The first material (M1) may include a compound expressed as XYa of a Chemical Formula. Here, X is one (e.g., only one) of molybdenum (Mo), tungsten (W), zirconium (Zr), or rhenium (Re) (e.g., one or only one selected from among Mo, W, Zr, and Re), Y is one (e.g., only one) of sulfur (S), selenium (Se), or tellurium (Te), (e.g., one or only one selected from among S, Se, and Te), and a is a natural number that is equal to or greater than 1. For example, the first material (M1) may include at least one of $MoS_2$, $MoSe_2$, $WS_2$, $WSe_2$, $MoTe_2$, $WTe_2$, $ZrS_2$, $ZrSe_2$, $ZrTe_2$, $ReS_2$, $ReSe_2$, or $ReTe_2$.

The second material (M2) may include at least one of tungsten (W), hafnium (Hf), tantalum (Ta), titanium (Ti), platinum (Pt), nickel (Ni), gallium (Ga), or zirconium (Zr) (e.g., at least one selected from among W, Hf, Ta, Ti, Pt, Ni, Ga, and Zr). An element included by the second material (M2) may be different from the element included by the first material (M1) (e.g., the second material is different in element from the first material). For example, when the first material (M1) is $MoS_2$, $MoSe_2$, and/or $MoTe_2$, the second material (M2) may include at least one of tungsten (W), hafnium (Hf), tantalum (Ta), titanium (Ti), platinum (Pt), nickel (Ni), gallium (Ga), or zirconium (Zr), when the first material (M1) is $WS_2$, $WSe_2$, and/or $WTe_2$, the second material (M2) may include at least one of hafnium (Hf), tantalum (Ta), titanium (Ti), platinum (Pt), nickel (Ni), gallium (Ga), or zirconium (Zr), when the first material (M1) is $ZrS_2$, $ZrSe_2$, and/or $ZrTe_2$, the second material (M2) may include at least one of tungsten (W), hafnium (Hf), tantalum (Ta), titanium (Ti), platinum (Pt), nickel (Ni), or gallium (Ga), and when the first material (M1) is $ReS_2$, $ReSe_2$, and/or $ReTe_2$, the second material (M2) may include at least one of tungsten (W), hafnium (Hf), tantalum (Ta), titanium (Ti), platinum (Pt), nickel (Ni), gallium (Ga), or zirconium (Zr).

A content (e.g., amount) of the second material (M2) doped to the first material (M1) may be equal to or less than about 7.5 wt % of the entire content (e.g., the total amount) of the semiconductor material (SM), for example, it may be about 3.0 wt % to about 7.5 wt %, and for example, it may be 5.0 wt % to about 7.5 wt %.

The second material (M2) doped to the first material (M1) may be substituted with an atom position of X in the compound expressed as XYa of the Chemical Formula. The second material (M2) may correct a defect of the compound expressed as XYa of the Chemical Formula.

As the content (e.g., amount) of the second material (M2) doped to the first material (M1) increases, a degree of correcting the defect may increase. For example, a ratio value of S/(Mo+W) indicating a degree of correcting the defect may increase as the content (e.g., amount) of the second material (M2) doped to the first material (M1) increases. As the defect position caused by X is substituted with the second material (M2) in the compound expressed as XYa of the Chemical Formula, the defect may be reduced.

A threshold voltage of the transistor including a semiconductor material (SM) according to one or more embodiments may have a positive value. As the content (e.g., amount) of the second material (M2) doped to the first material (M1) may increase, the threshold voltage of the transistor may be positively shifted. As the content (e.g., amount) of the second material (M2) doped to the first material (M1) increases, the threshold voltage of the transistor may move to a right on the XY coordinates. As the content (e.g., amount) of the second material (M2) doped to the first material (M1) increases, the threshold voltage variance of the transistor may increase compared to the case when the second material (M2) is not doped.

A carrier concentration may be reduced according to the content (e.g., amount) of the second material (M2) doped to the first material (M1). Hence, the threshold voltage of the transistor may be positively shifted. As the carrier concentration increases, the threshold voltage of the transistor may be negatively shifted which may be inappropriate for use in optical parts. The transistor according to one or more embodiments may control the content (e.g., amount) of the second material (M2) included in the semiconductor material (SM) to control the threshold voltage value and increase reliability.

Figure 3:
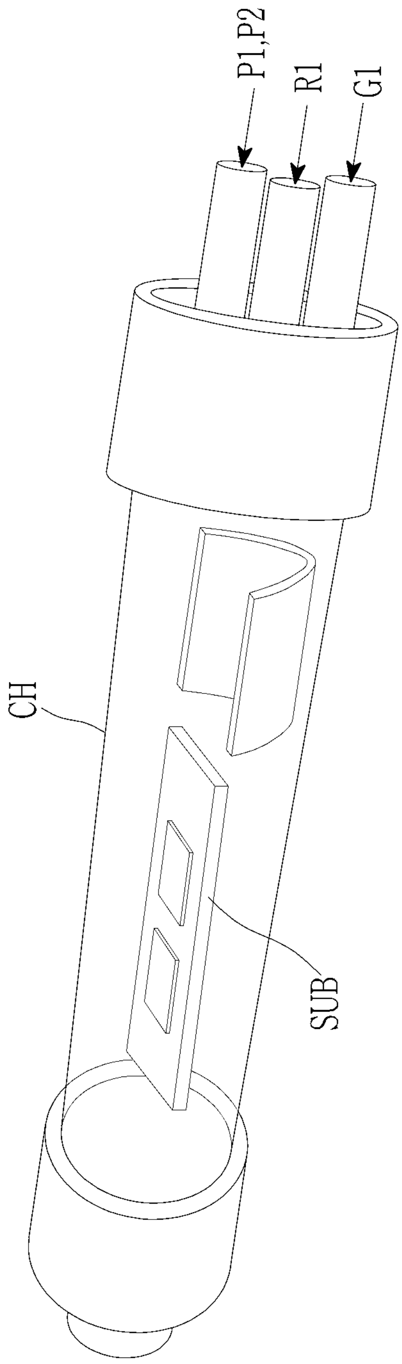
FIG. 3 shows a schematic view of a process for manufacturing a semiconductor material according to one or more embodiments.

A method for manufacturing a semiconductor material according to one or more embodiments will now be described with reference to FIG. 2 and FIG. 3. FIG. 3 shows a schematic view of a process for manufacturing a semiconductor material according to one or more embodiments.

The substrate (SUB) is positioned in the chamber (CH), and a first precursor (P1), a second precursor (P2), and a reactant (R1) for forming the semiconductor layer are injected. The first precursor (P1), the second precursor (P2), and the reactant (R1) are injected and are then allowed to react at a set or predetermined temperature and thereby form a semiconductor layer including a semiconductor material.

Regarding the method for manufacturing a transistor according to one or more embodiments, the semiconductor layer may be formed at about 600 degrees (° C.) to about 800 degrees (° C.), and is not limited thereto. The present specification shows the method for forming a semiconductor layer by using the chemical vapor deposition method, and without being limited thereto, various suitable methods such as the plasma chemical vapor deposition (PECVD) process, the atomic layer deposition (ALD) process, and/or the sputter process may be used.

The first precursor (P1), the second precursor (P2), and the reactant (R1) may react to form the semiconductor material (SM) according to one or more embodiments. The semiconductor material (SM) may, as described above, include a first material (M1) and a second material (M2) doped to the first material (M1). The first material (M1) may include a compound expressed as XYa of the Chemical Formula. Here, X may be an element included in the first precursor (P1), and Y may be an element included in the reactant (R1). The second material (M2) may be doped to the first material (M1). The second material (M2) may include an element included in the second precursor (P2).

In a process for inputting the first precursor (P1), the second precursor (P2), and the reactant (R1), an inert gas (G1) may be concurrently (e.g., simultaneously) injected. The inert gas (G1) may include at least one of Argon (e.g., Ar), Nitrogen (e.g., N2), or a mixed gas thereof.

The content (e.g., amount) that the second material (M2) is doped may be adjusted by adjusting an injecting speed of the inert gas (G1). For example, the injecting speed of the inert gas (G1) may be about 5 sccm to about 20 sccm, and as the injecting speed of the inert gas (G1) increases, the content (e.g., amount) of the doped second material (M2) may increase.

The first precursor (P1) may be $MoCl_5$, the second precursor (P2) may be $WCl_6$, and the reactant (R1) may be $H_2S$. When $MoCl_5$, $WCl_6$, and $H_2S$ are injected into the chamber and are allowed to react at about 750 degrees (° C.) for about seven minutes, $MoS_2$ to which tungsten (W) is doped may be obtained. In this instance, compared to molybdenum (Mo), tungsten (W) may have a strong combination force with sulfur (S) and may be doped to $MoS_2$. The doped tungsten (W) may be substituted with the position of molybdenum (Mo) to suppress or reduce formation of the defect, thereby manufacturing the reliability-improved semiconductor material. Further, as the first precursor (P1), the second precursor (P2), and the reactant (R1) are concurrently injected for one process, a time used may be reduced.

Figure 4:
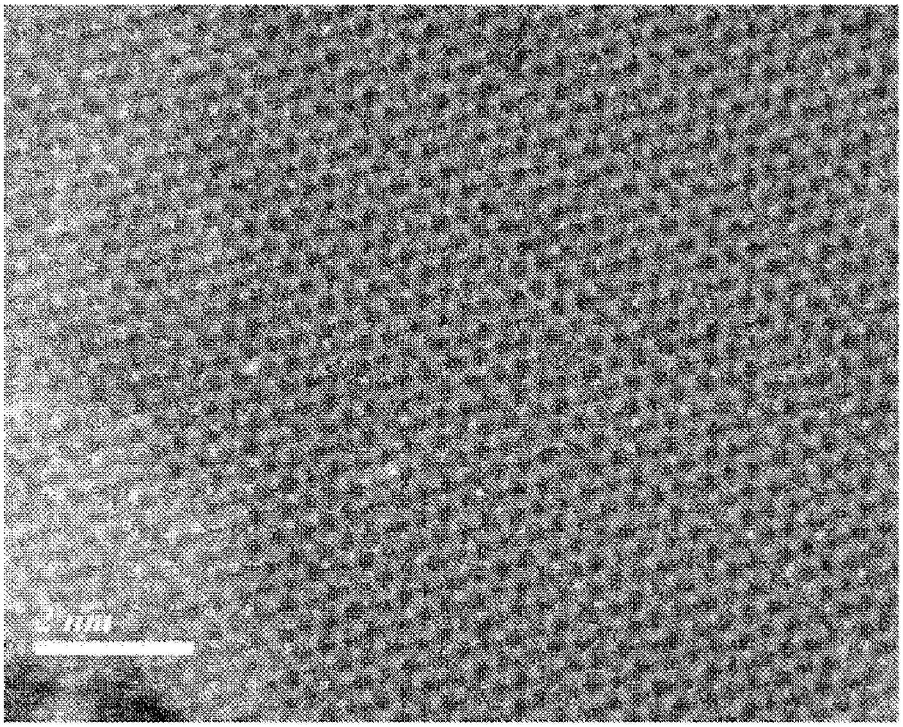
FIG. 4 shows a scanning transmission electron microscopy (STEM) image of a semiconductor material according to a comparative example.
Figure 6:
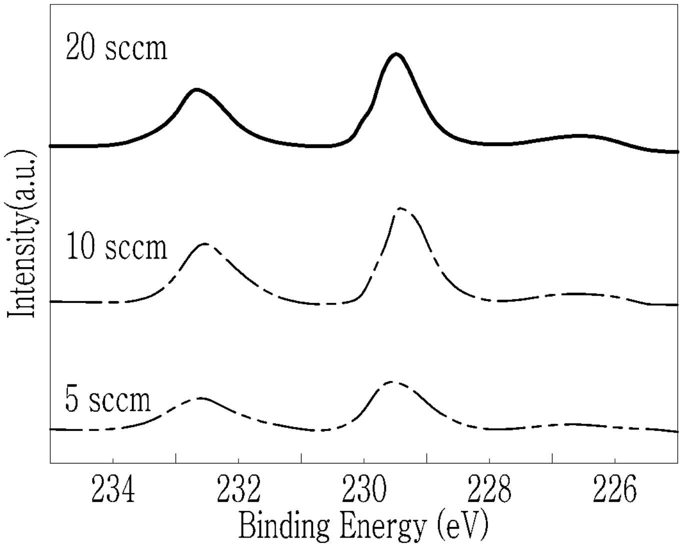
FIG. 6 shows an X-ray photoelectron spectroscopy (XPS) image of molybdenum from among semiconductor materials according to one or more embodiments.
Figure 7:
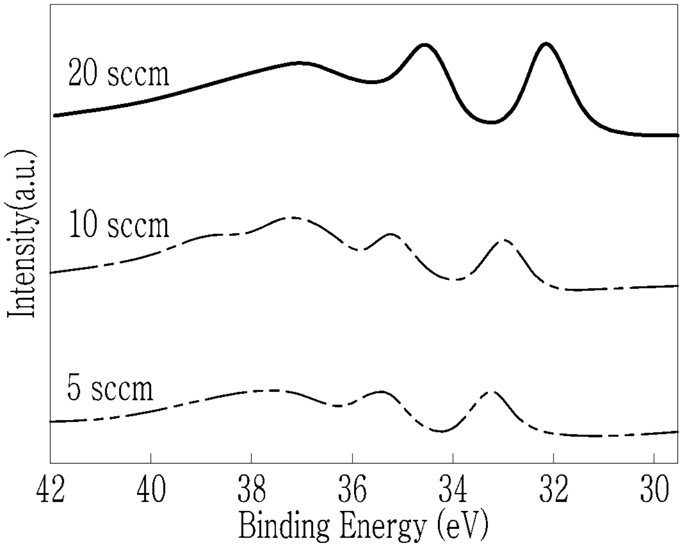
FIG. 7 shows an XPS image of tungsten from among semiconductor materials according to one or more embodiments.
Figure 8:
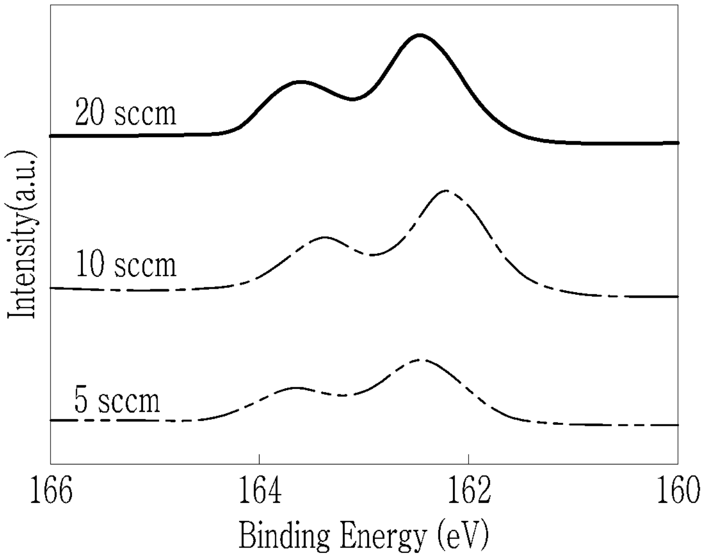
FIG. 8 shows an XPS image of sulfur from among semiconductor materials according to one or more embodiments.
Figure 9:
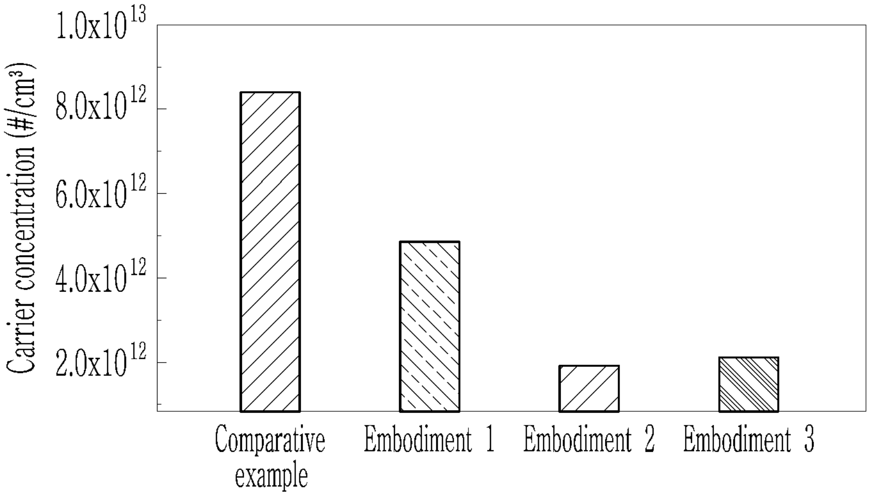
FIG. 9 shows a graph of carrier concentrations according to one or more embodiments and a comparative example.
Figure 10:
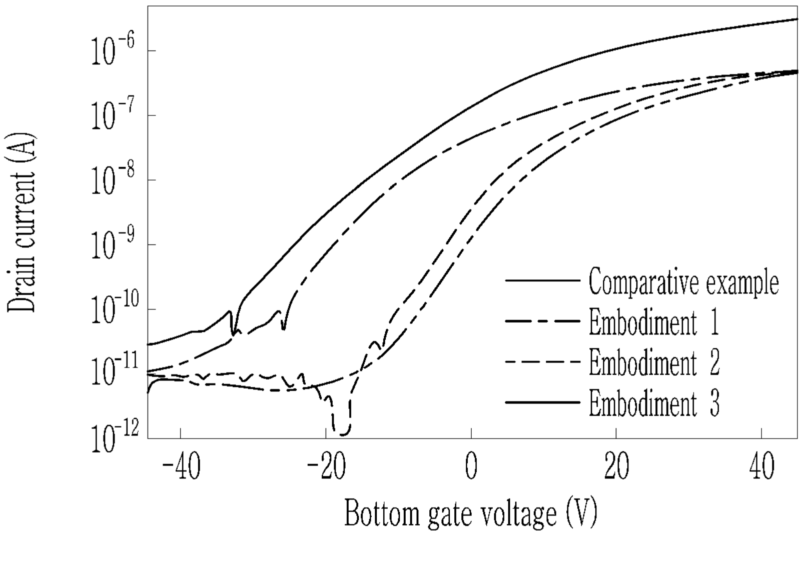
FIG. 10 shows a graph of drain currents with respect to bottom gate voltages.
Figure 11:
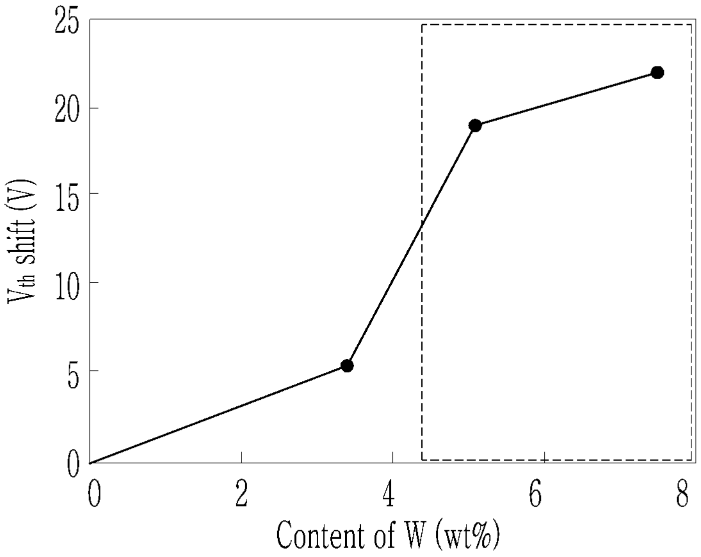
FIG. 11 shows a graph of threshold voltage changing degrees with respect to contents of tungsten included in semiconductor materials.

Characteristics of a semiconductor material according to one or more embodiments and a comparative example will now be described with reference to FIG. 4 to FIG. 11. FIG. 4 shows a STEM image of a semiconductor material according to a comparative example, FIG. 5 shows a STEM image of a semiconductor material according to one or more embodiments, FIG. 6 shows an XPS image of molybdenum from among semiconductor materials according to one or more embodiments, FIG. 7 shows an XPS image of tungsten from among semiconductor materials according to one or more embodiments, FIG. 8 shows an XPS image of sulfur from among semiconductor materials according to one or more embodiments, FIG. 9 shows a graph of carrier concentrations according to one or more embodiments and a comparative example, FIG. 10 shows a graph of drain currents with respect to bottom gate voltages, and FIG. 11 shows a graph of threshold voltage changing degrees with respect to contents of tungsten included in semiconductor materials.

FIG. 4 shows a STEM image of a semiconductor material manufactured without inputting a second precursor in a process for manufacturing a semiconductor layer. In more detail, FIG. 4 shows a STEM image of a semiconductor layer including $MoS_2$.

Figure 5:
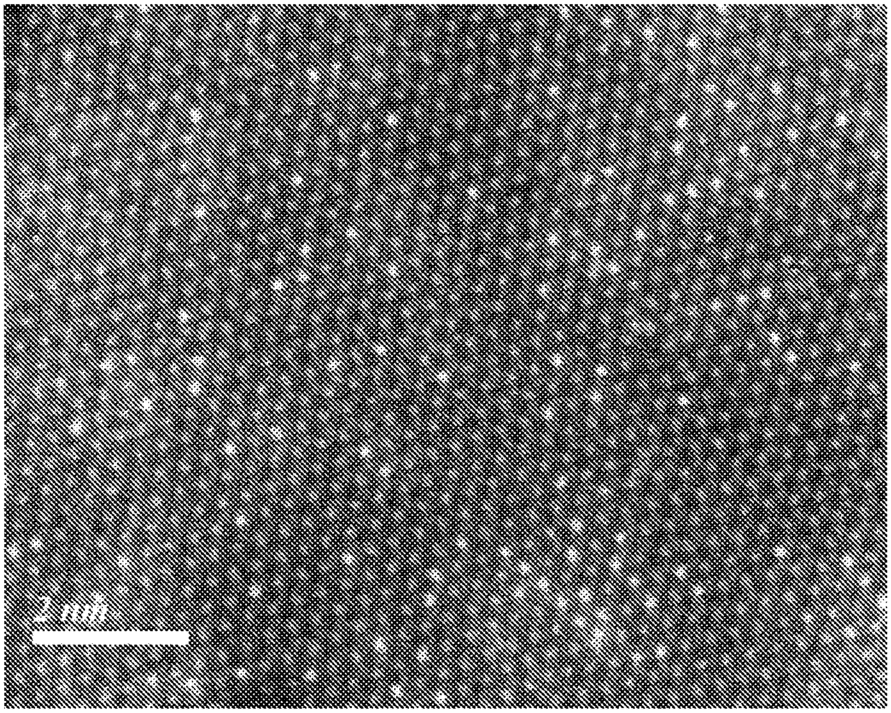
FIG. 5 shows a STEM image of a semiconductor material according to one or more embodiments.

FIG. 5 shows a STEM image of a semiconductor material manufactured by inputting a first precursor ($MoCl_5$), a second precursor ($WCl_6$), and a reactant ($H_2S$) in a process for manufacturing a semiconductor layer. W-doped $MoS_2$ is formed by concurrently inputting the first precursor ($MoCl_5$), the second precursor ($WCl_6$), and the reactant ($H_2S$).

Regarding the image shown in FIG. 5, it is found that W is stably doped to $MoS_2$, compared to the image shown in FIG. 4. Portions marked with bright spots in FIG. 5 indicate tungsten (W) substituted for the position of molybdenum (Mo).

An element content (e.g., amount) in the semiconductor material will now be described with reference to FIG. 6 to FIG. 8.

FIG. 6 shows a graph indicating that molybdenum (Mo) is included in the semiconductor material through an XPS analysis, particularly showing that the content (e.g., amount) of molybdenum (Mo) in the semiconductor material increases as the injecting speed of the inert gas increases to be 5 sccm, 10 sccm, and 20 sccm.

FIG. 7 shows a graph indicating that W is doped in the semiconductor material according to an XPS analysis. It is found that the content (e.g., amount) of tungsten (W) in the semiconductor material increases as the injecting speed of the inert gas increases to be 5 sccm, 10 sccm, and 20 sccm.

FIG. 8 shows a graph indicating that S is doped in the semiconductor material according to an XPS analysis. It is found that the content (e.g., amount) of sulfur (S) in the semiconductor material increases as the injecting speed of the inert gas increases to be 5 sccm, 10 sccm, and 20 sccm The S-defect has been described with reference to FIG. 6 to FIG. 8.

Referring to Table 1, it is found that the content (e.g., amount) of the tungsten doped into the semiconductor material increases to be 3.4 wt %, 5.1 wt %, and 7.5 wt % as the injecting speed of the inert gas increases to be 5 sccm, 10 sccm, and 20 sccm.

It is found that the content (e.g., amount) of the doped tungsten increases as the injecting speed of the inert gas increases, and a content (e.g., amount) ratio of molybdenum and tungsten changes as expressed in Table 1. It is found that the ratio of S/(Mo+W) for indicating a defect correcting degree has increased to 2.07, 2.10, and 2.11, compared to 1.88 of the comparative example. It is found that the defect is reduced and the defect is corrected as the defect position of Mo is substituted with W.

TABLE 1

| | Component | | | | S/(Mo + |
|---|---|---|---|---|---|
| $WCl_6$ dose | Mo (%) | W (%) | S (%) | Mo:W | W) ratio |
| 0 | 34.7 | — | 65.4 | — | 1.88 |
| 5 sccm | 29.2 | 3.4 | 67.4 | 0.90:0.10 | 2.07 |
| 10 sccm | 27.2 | 5.1 | 67.8 | 0.84:0.16 | 2.10 |
| 20 sccm | 24.6 | 7.5 | 67.8 | 0.77:0.23 | 2.11 |

Referring to FIG. 9 and FIG. 10, compared to the comparative example including the semiconductor layer to which the second material is not doped, the embodiment 1 represents a case of including the semiconductor layer to which 3.4 wt % of W is doped, the embodiment 2 represents a case of including the semiconductor layer to which 5.1 wt % of W is doped, and the embodiment 3 represents a case of including the semiconductor layer to which 7.5 wt % of W is doped. A width of the semiconductor layer of the transistor according to the comparative example, the embodiment 1, and the embodiment 2 may be 300 micrometers and a length thereof may be 4 micrometers. The gate insulating layer includes a silicon oxide with a thickness of 90 nanometers, and the source electrode and the drain electrode include titanium (Ti) having a 2 nanometer thickness and gold (Au) having a 40 nanometer thickness.

As shown in the graph of FIG. 9, it is found that the carrier concentration is reduced in order of the comparative example, the embodiment 1, and the embodiment 2. Regarding the graph shown in FIG. 10, it is found that the threshold voltage (Vth) is shifted to the right (i.e., positively shifted) as the carrier concentration is reduced in order of the comparative example, the embodiment 1, and the embodiment 2. When the carrier concentration increases, a negative shift for the threshold voltage to move to the left is generated.

For example, according to one or more embodiments described with reference to FIG. 9 and FIG. 10, it is found that a shift degree of the threshold voltage may be adjusted by controlling the content (e.g., amount) of the second material doped into the first material.

Table 2 expresses threshold voltage values according to the comparative example, the embodiment 1, the embodiment 2, and the embodiment 3. The threshold voltage values are extracted with reference to a drain current of $10^{-8}$ A.

TABLE 2

| | Comparative Example | Embodiment 1 | Embodiment 2 | Embodiment 3 |
|---|---|---|---|---|
| Vth (V) | −15 | −9.5 | 4 | 7 |

FIG. 11 shows threshold voltage variance with respect to changes of the content (e.g., amount) of doped tungsten in comparison to the comparative example, with reference to FIG. 10 and Table 2. Referring to FIG. 11, it is found that the variance of the threshold voltage increases as the content (e.g., amount) of the doped tungsten increases, compared to the case in which the tungsten is not doped. For example, when the embodiment 1 in which 3.4 wt % of W is doped is compared to the embodiment 2 in which 5.1 wt % of W is doped, and the content (e.g., amount) of the doped tungsten is increased by 1.7 wt %, the threshold voltage increases by 13.5 V. It is found that the changing degree of the threshold voltage is steep in a set or predetermined section according to the tungsten doping content (e.g., amount).

It is found from the above description that as the content (e.g., amount) of the doped second material (e.g., tungsten) increases, the negative shift of the threshold voltage is reduced, and particularly when the doping content (e.g., amount) of the second material is equal to or greater than 5 wt %, the threshold voltage has a positive value.

A device (e.g., a display device) including the transistor and/or any other relevant devices or components according to embodiments of the present invention described herein may be implemented utilizing any suitable hardware, firmware (e.g. an application-specific integrated circuit), software, or a combination of software, firmware, and hardware. For example, the various components of the device may be formed on one integrated circuit (IC) chip or on separate IC chips. Further, the various components of the device may be implemented on a flexible printed circuit film, a tape carrier package (TCP), a printed circuit board (PCB), or formed on one substrate. Further, the various components of the device may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the scope of the exemplary embodiments of the present invention.

While this present disclosure has been described in connection with what is presently considered to be practical example embodiments, it is to be understood that the present disclosure is not limited to the disclosed embodiments, but, on the contrary, is intended to cover various suitable modifications and equivalent arrangements included within the spirit and scope of the appended claims, and equivalents thereof.

DESCRIPTION OF SYMBOLS

CH: chamber
SUB: substrate
P1, P2: precursor
R1: reactant
G1: inert gas
SM: semiconductor material
M1: first material
M2: second material
ACT; semiconductor layer
GI: gate insulating layer
GE: gate electrode
ILD: inter-layer insulating layer
SE: source electrode
DE: drain electrode

What is claimed is:

1. A transistor comprising:

a semiconductor layer on a substrate;

a gate electrode overlapping the semiconductor layer; and a source electrode and a drain electrode electrically connected to the semiconductor layer, wherein the semiconductor layer comprises a second material doped to a first material, wherein the first material comprises a compound expressed as XYa of a Chemical Formula, wherein the second material is substitutionally doped at the X site of the first material expressed as XYa of the Chemical Formula, wherein X is one of molybdenum (Mo), tungsten (W), zirconium (Zr), or rhenium (Re), Y is one of sulfur (S), selenium (Se), or tellurium (Te), and a is a natural number that is equal to or greater than 1, wherein the second material comprises at least one of tungsten (W), hafnium (Hf), tantalum (Ta), titanium (Ti), platinum (Pt), nickel (Ni), gallium (Ga), or zirconium (Zr), and wherein the second material comprises an element that is different from the first material, and 5.0 wt % to 7.5 wt % of the second material is included with respect to an entire content of the semiconductor layer.

2. The transistor of claim 1, wherein the semiconductor layer comprises a semiconductor material with a layered structure.

3. The transistor of claim 1, wherein a thickness of the semiconductor layer is equal to or less than 1.5 nm.

4. The transistor of claim 1, wherein a threshold voltage of the transistor has a positive value.

5. The transistor of claim 4, wherein the threshold voltage is positively shifted as a content of the second material increases within the range of 5.0 wt % to 7.5 wt %.

6. A method for manufacturing a transistor, the method comprising:

forming a semiconductor layer on a substrate;

forming a gate electrode overlapping the semiconductor layer; and forming a source electrode and a drain electrode electrically connected to the semiconductor layer, wherein the forming the semiconductor layer comprises inputting a first precursor, a second precursor, and a reactant into a chamber to form a semiconductor material, wherein the semiconductor material comprises a second material doped to a first material, wherein the first material comprises a compound expressed as XYa of a Chemical Formula, wherein X is one of molybdenum (Mo), tungsten (W), zirconium (Zr), or rhenium (Re), wherein Y is one of sulfur (S), selenium (Se), or tellurium (Te), wherein a is a natural number that is equal to or greater than 1, wherein the second material comprises at least one of tungsten (W), hafnium (Hf), tantalum (Ta), titanium (Ti), platinum (Pt), nickel (Ni), gallium (Ga), or zirconium (Zr), wherein the second material is substitutionally doped at the X site of the first material expressed as XYa of the Chemical Formula, and wherein the second material comprises an element that is different from the first material, and 5.0 wt % to 7.5 wt % of the second material is included with respect to an entire content of the semiconductor layer.

7. The method of claim 6, wherein the forming the semiconductor layer comprises injecting an inert gas, and wherein a doping content of the second material is controlled according to an injecting speed of the inert gas.

8. The method of claim 6, wherein the semiconductor material is formed to have a layered structure.

9. The method of claim 6, wherein the semiconductor layer is formed to have a thickness of equal to or less than 1.5 nm.

10. The method of claim 6, wherein a threshold voltage of the transistor has a positive value.

11. The method of claim 6, wherein a threshold voltage is positively shifted as a content of the second material increases within a range of 5.0 wt % to 7.5 wt %.

* * * * *